United States Patent [19]

Fischer et al.

[11] Patent Number: 5,013,944
[45] Date of Patent: May 7, 1991

[54] PROGRAMMABLE DELAY LINE UTILIZING MEASURED ACTUAL DELAYS TO PROVIDE A HIGHLY ACCURATE DELAY

[75] Inventors: Jeffrey H. Fischer, Poughkeepsie, N.Y.; Lawrence J. Grasso, Austin, Tex.; Dale E. Hoffman, Stormville, N.Y.; Daniel E. Skooglund; Diane K. Young, both of Wappingers Falls, N.Y.

[73] Assignee: International Business Machines Corporation, Armonk, N.Y.

[21] Appl. No.: 340,999

[22] Filed: Apr. 20, 1989

[51] Int. Cl.$^5$ ............................. H03K 5/159
[52] U.S. Cl. ............................. 307/603; 307/595; 307/606; 328/55; 328/66
[58] Field of Search ............... 307/602, 603, 606, 595, 307/597; 328/55, 66

[56] References Cited

U.S. PATENT DOCUMENTS

| | | | |
|---|---|---|---|
| 3,781,822 | 12/1973 | Ahamed | 340/172.5 |
| 3,862,406 | 1/1975 | Brooks | 235/152 |
| 4,016,511 | 4/1977 | Ramsey et al. | 333/29 |
| 4,064,378 | 12/1977 | Kitayama et al. | 179/170.2 |
| 4,392,105 | 7/1983 | McLeod | 324/56 DE |
| 4,489,272 | 12/1984 | McLeod | 324/73 R |
| 4,504,749 | 3/1985 | Yoshida | 307/590 |
| 4,642,588 | 2/1987 | Kameya | 333/139 |
| 4,677,499 | 6/1987 | Shirota et al. | 358/339 |
| 4,677,648 | 6/1987 | Zurfluh | 375/120 |
| 4,686,458 | 8/1987 | Beyerbach | 324/83 D |
| 4,712,206 | 12/1987 | Lach | 324/83 D |
| 4,737,670 | 4/1988 | Chan et al. | 307/602 |
| 4,745,310 | 5/1988 | Swapp | 307/603 |

OTHER PUBLICATIONS

IBM Technical Disclosure Bulletin, vol. 8, No. 4, Sep. 1965, by W. E. Conners, "Variable Digital Delay Line," pp. 493–494.
IBM Technical Disclosure Bulletin, vol. 17, No. 12, May 1975, by E. J. Nosowicz et al., "Variable Electronic Delay System," pp. 3551–3552.
IBM Technical Disclosure Bulletin, vol. 30, No. 5, Oct. 1987, by E. Millham, "Digital Sub-Nanosecond Timing Generator," p. 287.

Primary Examiner—Stanley D. Miller
Assistant Examiner—Trong Phan
Attorney, Agent, or Firm—Jeffrey L. Brandt

[57] ABSTRACT

A method of operating a delay circuit to impose a selected delay on an electronic signal the delay circuit comprising a plurality of delay stages and means for directing the electronic signal through selected ones of the delay stages, the method comprising the steps of: measuring the actual signal delay through each of the delay stages; and selecting, based on the signal delays obtained in the measuring step, the delay stages through which the electronic signal is directed.

21 Claims, 5 Drawing Sheets

PROGRAMMABLE DELAY LINE UTILIZING MEASURED ACTUAL DELAYS TO PROVIDE A HIGHLY ACCURATE DELAY

The present invention relates generally to signal delay circuits and more specifically to a programmable delay line for imposing a selectable, highly accurate time delay on an electronic signal.

BACKGROUND OF THE INVENTION

The ability to generate repeatable, highly precise time delay increments is critical in many digital signal processing systems. Automated testing systems, for example, of the type used to test Very Large Scale Integrated (VLSI) logic circuits and memory arrays require the ability to generate selectable time delays accurate in the picosecond (ps) range.

Because such testing systems are used to test chips having input/output (I/O) pin counts which may approach or even exceed 200-500 in number, highly accurate signal delays of the above-described type must be generated in proportionately large quantities: i.e. for a high percentage of the I/O pins. Thus, circuits for generating such delays must not only be capable of providing the required accuracy, but must also be economical in size and cost so as to be practical for use in large quantities.

U.S. Pat. No. 4,016,511 to Ramsey et al. shows a programmable, variable length digital delay circuit wherein clocked, shift register delay devices of variable lengths are interconnected by digitally controllable switches. Control of the switches effects control of the delay. However, the Ramsey et al. circuit suffers from the disadvantage of having time delay increments limited to the clock speed used to clock the registers. Further, the Ramsey et al. circuit requires the implementation of a relatively complex, expensive switching arrangement.

U.S. Pat. No. 3,781,822 to Ahamed shows a data rate-changing and reordering circuit wherein a plurality of series-connected stages are provided, each stage including a pair of parallel delay paths, each delay path providing a different delay time. In Ahamed, the outputs of each pair of delay paths are connected such that data sent through the different paths is recombined in a desired order. The actual delay times in the various paths are selected not to provide adjustable fine delays, but to effect a desired rate-change or reordering of the processed data.

U.S. Pat. No. 3,526,840 to Wheaton, Jr. shows a steering and timing circuit comprising multiple, series connected stages, each stage including a pair of parallel paths, each path providing a different delay time. In Wheaton, Jr., the first path is a minimal delay path through a gate, while the second path is a longer delay path through a monostable multivibrator. Such an arrangement could not provide the fine delay times provided by the subject invention.

U.S. Pat. No. 4,737,670 to Chan shows a circuit for generating a constant delay between an input and an output, regardless of changes in gate delays due to variable factors such as temperature and power supply voltage levels. The circuit includes a ring oscillator circuit constructed on the same semiconductor chip as a variable delay circuit. The frequency of the ring oscillator circuit is measured periodically, and used to select the appropriate delay. Thus, if the frequency of the ring oscillator circuit changes, the appropriate variable delay is selected to provide the desired constant delay. The subject system is designed to provide a constant delay, and not the programmable, selectable delay of the present invention.

U.S. Pat. No. 4,504,749 to Yoshida shows a delay pulse generating circuit which uses a variable delay in a circuit for generating a desired delay. The variable delay is connected in a feedback loop so as to oscillate during a calibration period. The oscillation frequency is measured, the delay through the circuit is calculated and compared with a desired delay, and a circuit is provided for adjusting the variable delay to achieve the desired delay. A binary search routine is provided for adjusting the variable delay to achieve the desired delay. As with the patent to Chan, described above, the subject patent is directed to a circuit which is calibrated to provide a single, accurate delay.

SUMMARY OF THE INVENTION

The principle object of the present invention is to provide a new and improved delay circuit.

Another object of the present invention is to provide a delay circuit capable of providing highly precise time delays in the sub-nanosecond range.

A further object of the present invention is to provide a delay circuit of the above-described type capable of providing selectable time delays.

Another object of the present invention is to provide a delay circuit of the above-described type which can be implemented in an integrated circuit environment using a relatively economical quantity of readily available components.

Yet another object of the present invention is to provide a delay circuit of the above-described type which is easily and quickly calibrated to accommodate internal variations such as those caused by changes in ambient temperature, supply voltages, and manufacturing process variations.

In accordance with the present invention, there is provided a new and improved method of operating a delay circuit to impose a selected delay on an electronic signal, the delay circuit comprising a plurality of delay stages and means for directing the electronic signal through selected ones of the delay stages, the method comprising the steps of: providing the plurality of delay stages each having one substantially fixed but not precisely know delay; measuring the actual signal delay through each of the delay stages; and selecting, based on the signal delays obtained in the measuring step, the delay stages through which the electronic signal is directed.

In accordance with another aspect of the present invention, there is provided a delay circuit for imposing a selected delay on an electronic signal, comprising: a plurality of delay stages, each having one substantially fixed but not precisely know delay means for directing the electronic signal through selected ones of the delay stages; means for measuring the actual signal delay through each of the delay stages; and means for selecting, based on the actual signal delays obtained in the measuring step, the delay stages through which the electronic signal is directed.

BRIEF DESCRIPTION OF THE DRAWINGS

These and other objects, features and advantages of the present invention will be apparent from a consideration of the following detailed description and drawings, in which.

DETAILED DESCRIPTION OF THE INVENTION

Figure 1:
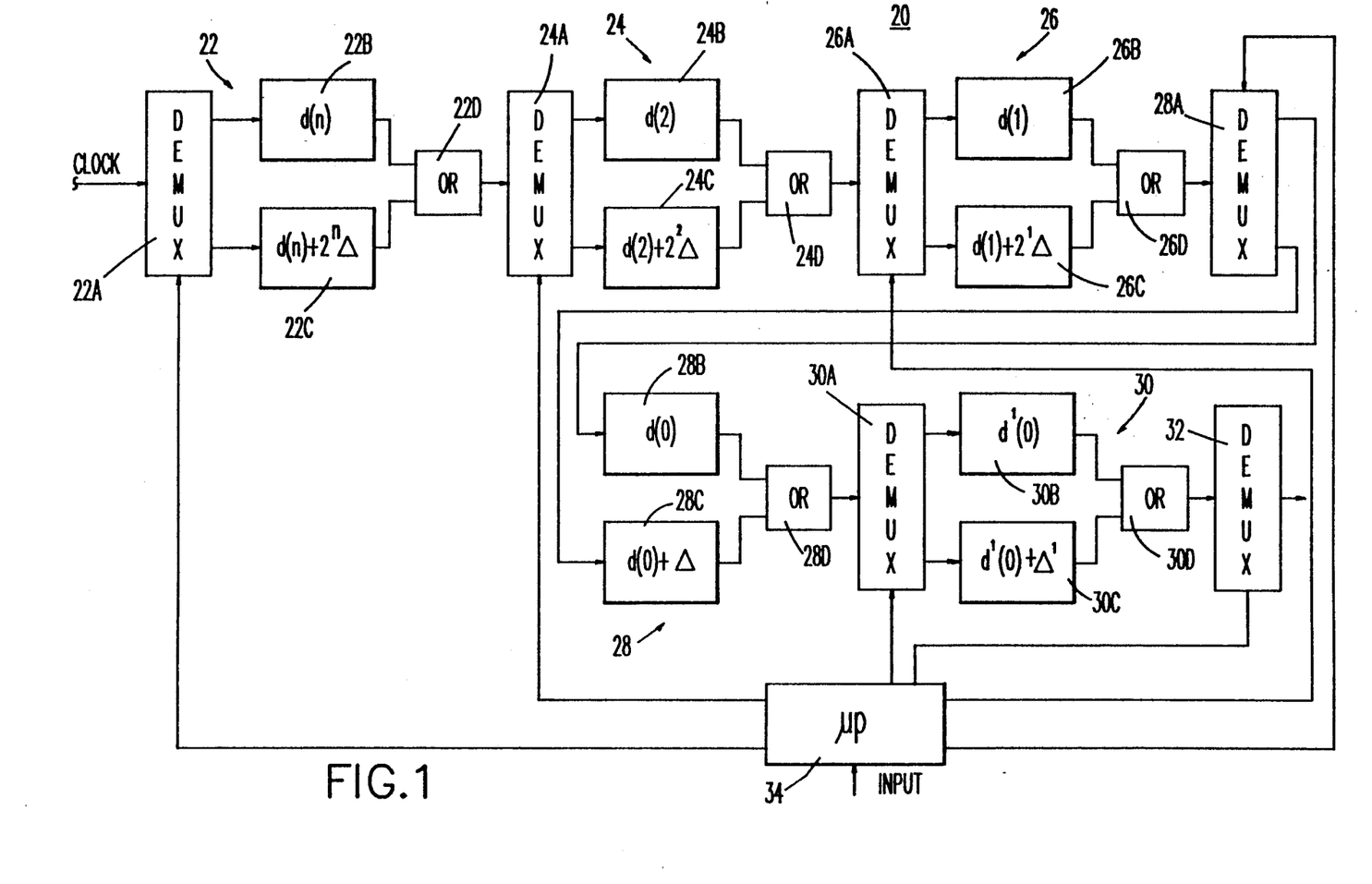
FIG. 1 is a block diagram of a delay circuit implemented in accordance with the present invention.

Referring now to FIG. 1, a circuit 20 is shown for imposing a selectable, highly accurate time delay, relative to a circuit path of minimum delay, on a digital/pulse electronic input signal. This time delay is referred to herein as a "differential delay".

Circuit 20 includes five series-connected delay stages 22, 24, 26, 28, 30, each stage including a demultiplexer (DEMUX) 22A-30A, a first circuit path 22B-30B of minimum time delay, a second circuit path 22C-30C of minimum delay plus an additional delay, and a logical OR gate 22D-30D. As described below, the "C" circuit paths 22C-30C are connected in parallel with their corresponding "B" circuit paths 22B-30B between bracketing pairs of DEMUXs and OR gates.

DEMUX 22A is connected to receive a digital clock input signal CLOCK and to steer that signal to a selected one of circuit paths 22B or 22C. Logical OR gate 22D is selected to receive the outputs from both of circuit paths 22B, 22C. DEMUX 24A is connected to receive the output of OR gate 22D, and to steer the output of the OR gate to a selected one of circuit paths 24B or 24C. DEMUXs 26A, 28A, and 30A are likewise connected to receive the output of the OR gate from the previous stage, and to steer the signal to a selected one of the circuit paths in the subsequent stage.

An input DEMUX 32 is connected to receive and drive the output signal from OR gate 30D. A microprocessor 34 has an input connected to receive data from at least two period counters (FIGS. 3, 5), and outputs connected to each of DEMUXs 22A-30A and 32 for controlling the DEMUXs in a manner described below.

Figure 2:
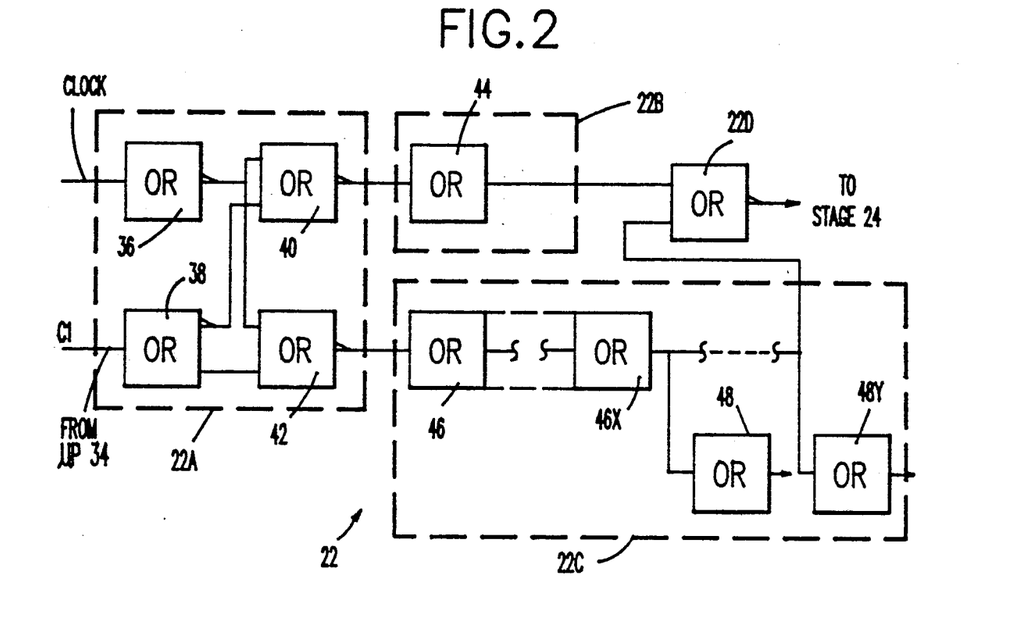
FIG. 2 is a schematic diagram illustrating one means of implementing the delay stages of the circuit of FIG. 1 using conventional digital logic circuits.

Examining now FIG. 2, one embodiment of delay stage 22 is shown wherein DEMUX 22A comprises four logical OR gates 36, 38, 40, 42. Gate 36 has an input connected to receive clock signal CLOCK, and an inverting output connected to a first input for each of gates 40, 42. Gate 38 has an input connected to receive a control signal C1 from microprocessor 34, an inverting output connected to the second input of gate 40, and a non-inverting output connected to the second input of gate 42.

Circuit path 22B comprises a single logical OR gate 44 having its input connected to an inverting output of gate 40, and an output connected to an input of gate 22D. Circuit path 22C comprises X series-connected logical OR gates 46-46X, the first gate having its input connected to an inverting output of gate 42. The output of gate 46X is connected in parallel to one input of Y parallel-connected gates 48-48Y, and to the second input of gate 22D.

It will be understood that subsequent delay stages 24-30 of delay circuit 20 are constructed similarly to the embodiment of delay stage 22 shown and described in FIG. 2, the only difference being the number of series and parallel connected gates, X and Y, respectively, in the "C" delay paths. In a manner described in further detail below, the arrangements of gates in each of the "C" circuit paths is selected to provide a desired signal delay.

In operation, described particularly with respect to the notation used in the "B" and "C" delay paths of stage 22, delay path 22B is constructed so as to provide a typical time delay d(n). Delay path 22C is constructed to provide a time delay approximately equal to the delay d(n) of signal path 22B, plus an additional delay of $2^n \times$ delta (delta$2^n$) where: delta equals a minimum, physically realizable delay increment, and n is a power of 2 selected dependent on a desired maximum delay, and generally determinative of the number of delay stages in circuit 20 (not including multiple minimum, $2^0$ delay stages such as stages 28, 30).

In the preferred embodiment of the invention shown, each "C" delay path 22C-28C of delay circuit 20 includes an additional delay, relative to its corresponding "B" circuit path, equal to a power of 2 times the delta delay, and the various "C" delay paths are arranged relative to one-another in ascending/descending binary order. Assuming, for purposes of describing the present invention that n=3, circuit 20 thus includes 4 stages: n=3 (stage 22), n=2 (stage 24), n=1 (stage 26), n=0 (stage 28), and one extra n=0 stage (stage 30) for purposes of increasing delay accuracy in a manner described below. The resulting additional "C" delay path is what is commonly referred to in the art as a binary ladder.

Examining the delays in each of the stages, delay path 22C includes a delay of $2^3 \times$ delta (delta$2^3$) relative to path 22B. Delay path 24C includes a delta$2^2$ delay relative to path 24B. Likewise, delay paths 26C, 28C, and 30C include delta delays of delta$2^1$, delta$2^0$, and delta$1 2^0$, relative to their corresponding "B" delay paths. In a manner described in further detail below, the additional delays in the "C" circuit paths (relative to their corresponding "B" circuit paths), are provided through the appropriate selection of gates in the "B" and "C" circuit paths (i.e. the numbers X, Y of series, parallel connected gates).

For purposes of describing the present invention, it will be assumed that a logical OR gate such as gate 44 or 46, when driving a single output load, exhibits a typical delay time of about 160 picoseconds (ps). Each series-connected gate, such as gate 46, thus increases the signal delay time through a circuit path "C" by approximately 160 ps, allowing large values of delay to be obtained To obtain smaller values of delays, a parallel-connected gate, such as gate 48, will be provided and assumed to increase the signal delay time through the circuit path by approximately 20 ps.

It will be understood that the gate delay time is a function of the fabrication of a gate, and may vary considerably from the 160 ps (series) and 20 ps (parallel) examples selected for purposes of explaining the operation of the present invention.

Further, it is a fundamental consideration of the present invention that, due to uncontrollable variations in logic gate fabrication and interconnection, no given logic gate is likely to exhibit the exact, typical delay — assumed here to be 160 ps for a series- and 20 ps for a parallel-connected gate. It is well known in the art that variations in external conditions, particularly ambient temperature and supply voltage levels, will also cause the gate delays to vary in a proportional manner.

Continuing to describe the operation of the present invention, the assumption is continued that circuit 20 is constructed to have n=4 delay stages 22, 24, 26, 28, and an extra, minimum $2^0$ delay stage 30. It will further be assumed that it is desired to realize a minimum delta delay of 20 ps. From a consideration of the above discussion of gate delay times, it will be apparent that a minimum delta delay of 160 ps is realizable with a single, series-connected gate, or multiple, parallel-connected gates.

Pursuant to the above-described parameters, "B" circuit paths 22B–30B are selected to exhibit typical delays of $d(3)=d(2)=d(1)=d(0)=d^1(0)=160$ ps (approximately). These delays are set by the selection of the number and connection of gates in each of the "B" delay paths. Delay path 22C has the gates therein connected to provide a delay of 160 ps $+23\times20$ ps $=320$ ps. Circuit path 24C is constructed to exhibit a time delay of 160 ps $+22\times20$ ps$=240$ ps, and circuit path 26C a delay of 160 ps $+21\times20$ ps$=200$ ps. Likewise, circuit paths 28C and 30C are each constructed to provide a minimal delay: 160 ps $+20\times20$ ps $=180$ ps.

Because of the variations in individual gate delays as described above, it will be understood that the various delay paths cannot be constructed to have the exact desired delays. However, through a combination of theoretical calculation and, where practical, actual measurements, the various "B" and "C" delay paths are fabricated to be as close to the desired delays as is practicable.

Subtracting the typical "B" stage delay of $d(n)=160$ ps from each "C" delay stage, Table 1 below sets out the theoretical additional delay available through each of circuit paths 22C–30C.

TABLE 1

| Circuit Path | Theoretical Additional Delay |
| --- | --- |
| 22C | $2^3 \times 20$ ps = 160 ps |
| 24C | $2^2 \times 20$ ps = 80 ps |
| 26C | $2^1 \times 20$ ps = 40 ps |
| 28C | $2^0 \times 20$ ps = 20 ps |
| 30C | $2^0 \times 20$ ps = 20 ps |
| | 320 ps = max. additional delay |

From a consideration of the above, it will be understood that, through appropriate control of the DEMUXs 22A–30A by micro-processor 34 in accordance with a method described below, delay circuit 20 is capable of generating a pulse having a selected additional delay of between 20 ps and 320 ps, in binary 20 ps (minimum delta delay) increments. This selected, or differential delay is relative to a minimally delayed pulse propagated exclusively through circuit paths "B".

However, while circuit 20 provides for a differential time delay in very fine increments of about 20 ps, for the reasons described above, no particular gate in circuit 20 can be expected to exhibit the exact, theoretical delay. Each delta delay path 22C–30C will thus vary to some extent from the theoretical delay set out in Table 1.

A method and apparatus for more exactly calibrating the time delays selectable with delay circuit 20 will now be described with respect to FIGS. 3 and 4.

Figure 3:
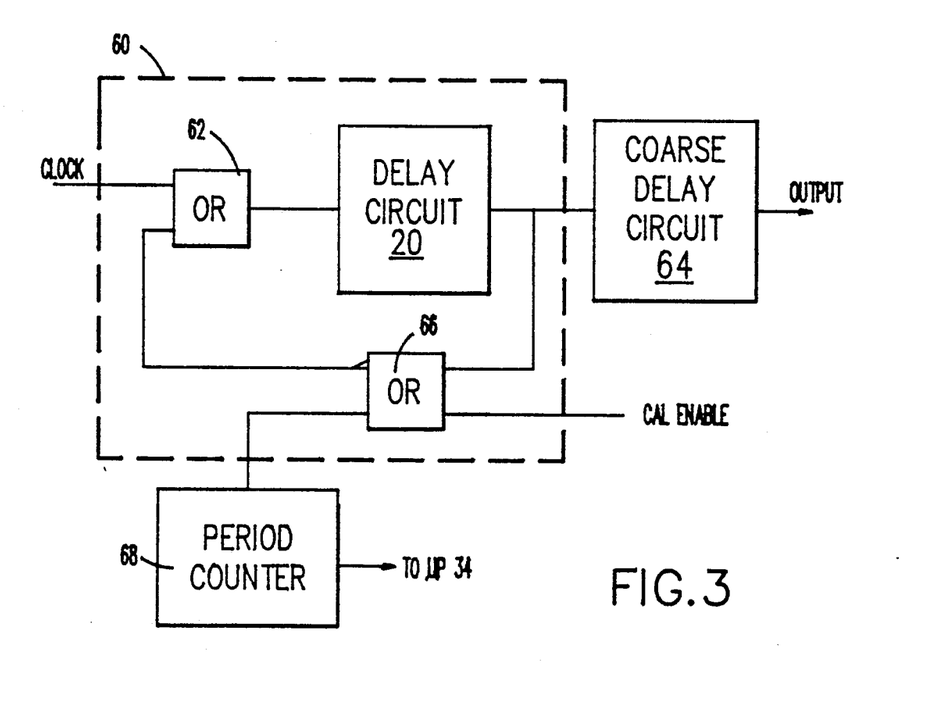
FIG. 3 is a block diagram showing means for calibrating the delay circuit of FIG. 1.

Referring first to FIG. 3, a calibration circuit 60 is shown for calibrating the operation of delay circuit 20 so that actual additional delays can be measured through each circuit path 22C–30C. Calibration circuit 60 includes a logical OR gate 62 having a first input connected to receive clock signal CLOCK, and an output connected to the input of delay circuit 20. The output of delay circuit 20 is connected both to an optional coarse delay circuit 64 and to the first input of a logical OR gate 66. The output of coarse delay circuit 64 is provided for subsequent use by a system (not shown) requiring much larger delays that are multiples of the input clock of the present invention. For example, an integrated circuit testing system.

Gate 66 has a second input for receiving a calibration enable signal CAL ENABLE, a noninverting output connected to a period counter 68, and an inverting output connected back to the second input of gate 62. A feedback loop is thus formed between the input and output of delay circuit 20 via gates 66 and 62.

Coarse delay circuit 64 comprises a circuit, many configurations of which are known to those skilled in the art, for adding a coarse time delay to the relatively fine time delay provided by delay circuit 20. Period counter 68 comprises a conventional period counter, preferably accurate to about one one-hundreth of the delta time delay selected in signal path "C" of delay circuit 20. One such period counter comprises the Hewlett Packard model HP5385A frequency counter, accurate to approximately 0.01 ps.

In operation, the calibration enable signal CAL ENABLE is selected to enable gate 66 whenever it is desired to measure the actual (vs. the theoretical, or typical) time delays through the signal paths of delay circuit 20: i.e. to measure both the total minimum delay through the "B" signal paths and the delay (including the additional delay) through each of the "C" signal paths. Such calibration may be performed, for example, on first applying power to delay circuit 20, and periodically thereafter during the operation of the circuit.

With gate 66 and period counter 68 both enabled, the period counter will accurately count the time period between adjacent digital pulses provided thereto. Microprocessor 34 is first operated to control DEMUXs 22A–30A so as to select the minimum time delay path, i.e. the "B" signal path in each of stages 22-30. Period counter 68 thus measures the actual minimal delay through delay circuit 20. After this minimal delay is known, microprocessor 34 is operated to control the same DEMUXs so as to select, one at a time, the relatively delayed, or "C" signal paths, through delay circuit 20, while the remaining DEMUXs select a "B" signal path. Thus, as each "C" signal path is selected, its actual additional delay relative to the minimum signal delay is straightforwardly determined by subtracting the delay with the selected "C" signal path switched in from the minimum delay "B" signal path. This calculation is preferably performed in microprocessor 34. When each of the "C" signal paths 22C–30C has been selected in turn, the actual additional delay through each of these circuit paths is known.

Table 2, set out below, includes a set of exemplary, actual/measured additional delays for the circuit paths 22C–30C. Such actual delays are obtained using the calibration circuit of FIG. 3 in the manner described immediately above.

TABLE 2

| Delay Stage | Theoretical Add. Delay | Actual Add. Delay |
|---|---|---|
| 22C | 160 ps | 152.5 ps |
| 24C | 80 ps | 85.8 ps |
| 26C | 40 ps | 36.3 ps |
| 28C | 20 ps | 17.2 ps |
| 30C | 20 ps | 16.7 ps |

Figure 4A:
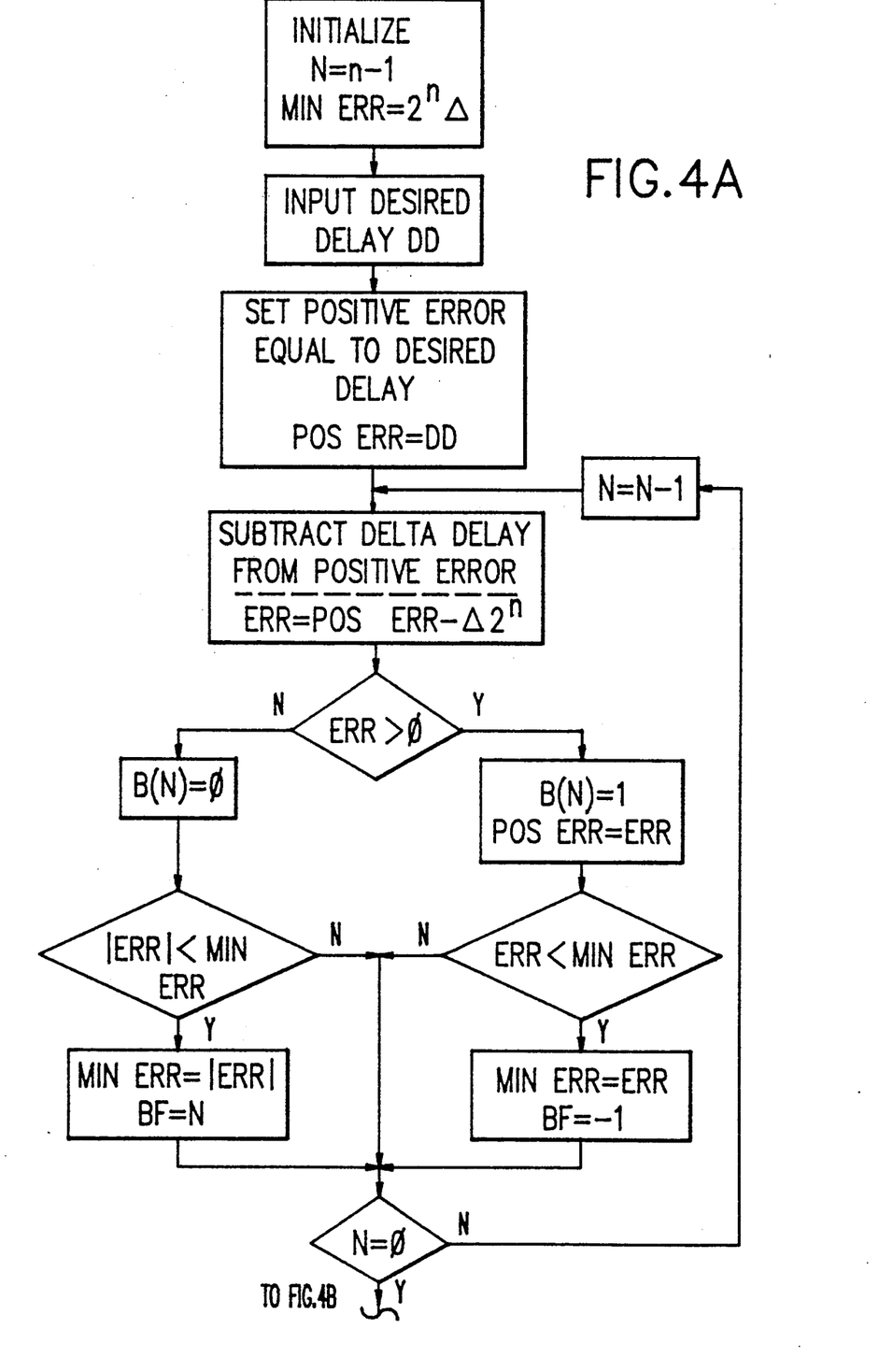
FIGS. 4A and 4B comprise a flow chart showing a process for operating the delay circuit of FIG. 1 to achieve a highly accurate delay.

Referring now to FIG. 4A, a method is provided for using the actual additional delays measured in circuit paths 22C–30C to determine the signal path through delay stages 22–30 which will provide a differential delay closest to a desired delay DD. The method will be described first in general, and then in an example with circuit 20 having the theoretical and actual delta delays set out in Table 2 above.

In general, the method and apparatus of the present invention permit the selection of a desired delay based on the theoretically possible delays (i.e. a power of 2 times the delta delay). However, because the actual delays measured through the various signal stages differ from the theoretical delays, a differential delay is generated, based on the actual delays, which has the smallest possible error relative to the desired delay.

Generally, starting with the largest additional delay stage and continuing in descending order, each actual delay is added to a previously selected total delay. If the selection of that actual delay provides a differential delay having a smaller error relative to the desired delay, then a record is made and that delay stage is selected for use in generating the differential delay. If the selection of that actual delay results in a differential delay having a larger error relative to the desired delay, then the actual delay is not selected. When all of the actual delays have been utilized as described above, the selected, actual, differential delay will provide the smallest possible error relative to the theoretical desired delay.

The method assumes the availability of a bit storage array B(N) having a flag bit for each of the n+1 delay stages in circuit 20 (i.e. a 1×5 array). The error between the desired delay DD and the calculated delay at any given time during the execution of the method is indicated by ERR. The method is typically executed as a computer program in microprocessor 34.

The following Table 3 defines the variables used in the subject method. Those variables indicating they may be measured in seconds are, of course, measures of time.

TABLE 3

DD - desired delay (seconds)
B(n) - bit flag for an n-long array
BF - bit flag counter
ERR - delay error (sec.)
MIN ERR - minimum error (sec.)
POS ERR - positive error (sec.)
N - cycle counter
delta$2^n$ - actual, additional delay at the $2^n$ "C" circuit path The method is initiated by setting a cycle counter N equal to the number of delay stages in the delay line circuit minus 1, and the minimum error MIN ERR to the actual additional delay delta$2^n$ of the largest delay stage.

The desired delay DD is entered, and positive error POS ERR is set equal to the desired delay DD. The additional delay delta$2^n$ is subtracted from the positive error POS ERR to calculate error ERR.

The error delay ERR is checked to determine if it is greater than or less than 0. The "greater than 0" operations will be described first.

Assuming that the error delay ERR is greater than 0, the bit flag associated with the n delay stage B(N) is set equal to one, indicating that that additional delay (i.e. that "C" signal path) will be used, and the positive error POS ERR is set equal to the error ERR.

The error ERR is checked to determine if it is less than the minimum error MIN ERR. If error ERR is less than minimum error MIN ERR, then MIN ERR is set equal to ERR, and bit flag counter BF is set equal to −1, indicating the minimum error occurred when error ERR was positive. If error ERR is greater than minimum error MIN ERR, than the above steps are not performed. Next, N is checked to see if it is zero. If N is not equal to zero, then N is decremented and the loop is repeated.

Describing now the operation when the error delay ERR is less than zero, the addition of more additional delays would result in a more negative delay error ERR. Therefor, the bit flag B(N) is set to zero so as not to select the present additional delay (i.e. not to select the present "C" delay stage). The magnitude of the delay error [ERR] is checked to see if it is less than the minimum error MIN ERR. If it is, then the minimum error MIN ERR is set to the magnitude of the delay error ERR, and the bit flag counter BF is set to N to indicate that the minimum error MIN ERR occurred for a negative delay error ERR, and to indicate at which additional delay stage n it occurred. If the magnitude of the delay error [ERR] is not less than the minimum error MIN ERR, then the above steps are not performed. Next, N is checked to see if it is equal to zero. If N is not equal to zero, then N is decremented and the loop is repeated.

The above-described process is repeated for as long as N is not equal to (i.e. N is greater than) zero. When N=0, the bit flags B(N) identify the "C" signal paths which give the smallest positive minimum error relative to the desired delay. However, it is also possible that the minimum error occurred for a negative delay error.

Figure 4B:
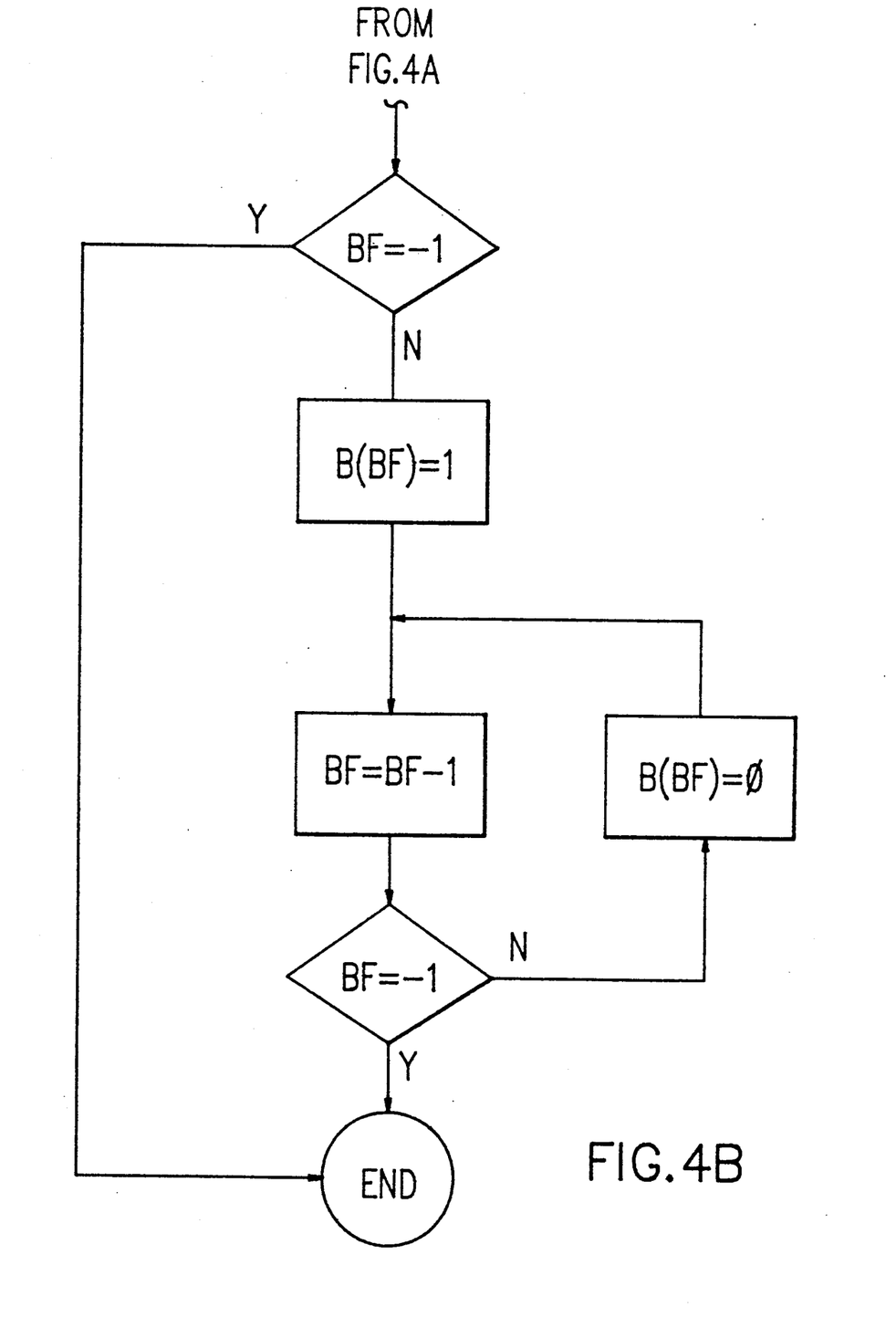

Referring now to FIG. 4B, the bit flag counter BF is checked to see if it equals −1. If it does, it indicates that the minimum error occurred for a positive delay error and the bit flags B(N) identify the "C" signal paths which will provide the best differential delay. The program is thus ended.

If the bit flag counter BF is not equal to −1, it indicates that the minimum error occurred for a negative delay error, and that it occurred during the loop cycle when N=BF. Therefor, all delays that were selected when N>BF stay selected. Delay (BF) is also selected by setting B(BF) equal to 1. The additional delays for which N> BF are all deselected. These last steps are shown in the lower loop in FIG. 4B. After B(BF) is set to 1, the bit flag counter BF is decremented and checked to see if it is equal to −1. If it is not, then B(BF) is set to zero (i.e. that "C" stage additional delay is deselected) and the lower loop is repeated. The program is ended when the bit flag counter BF is found equal to −1.

Upon the completion of the process shown in FIGS. 4A, 4B, the optimal path through delay circuit 20 (FIG.

1) is chosen, the "C" circuit path being selected for each delay stage wherein the bit flag array B(N) =1. As will be appreciated from a consideration of the example below, the above-described method provides a differential delay, based on the actual measured delta delay for each "C" circuit path, which is closest to the desired delay DD. As will also be appreciated, the circuit path thusly calculated may differ from that which would be calculated based on theoretical delta delays.

The above-described process will now be illustrated with respect to two separate examples: the first example having a desired delay DD of 240 ps, and the second example having a desired delay DD of 100 ps.

EXAMPLE 1

The values obtained in performing the above-described process for a desired delay DD of 240 ps are set out in summary form in Table 4 below. The process is started by initiating cycle counter N equal to the number of stages in circuit 20 minus 1: N =5−1 =4. The minimum error MIN ERR is set equal to the highest order actual delay: MIN ERR =delta$2^3$=152.5 ps (all actual delays are obtained from Table 2 above).

With N=4, positive error POS ERR is set equal to desired delay DD: POS ERR =240 ps. The actual delay delta$2^n$ is subtracted from positive error POS ERR to obtain error ERR: ERR =240−152.5=87.5 ps. Because error ERR is greater than 0, bit flag B(4) is set to 1, and positive error POS ERR is set equal to ERR: POS ERR =87.5 ps. Because error ERR is less than minimum error MIN ERR (87.5<152.5), MIN ERR is set equal to ERR: MIN ERR =87.5 ps, and bit flag counter BF is set equal to −1.

With N decremented so that N=3, ERR=POS ERR−delta$2^2$: ERR=87.5−85.8=1.7. Because ERR is greater than 0, B(3) is set to 1, and POS ERR=ERR=1.7. Because ERR<MIN ERR (i.e. 1.7<87.5), then MIN ERR is set equal to ERR, and bit flag counter BF is set equal to −1: MIN ERR=1.7, BF=−1.

With N decremented to N=2, ERR=POS−delta$2^1$: ERR=1.7−36.3=−34.6. Because ERR is less than 0, B(2) is set to 0. Because abs(ERR) is not less than MIN ERR (i.e. abs(−34.6) is not less than 1.7), N is decremented and the loop is repeated. POS ERR, MIN ERR, and BF remain unchanged.

With N decremented to N=1, ERR=POS ERR−delta$2^0$: ERR=1.7−17.2=−15.5. Because ERR is less than 0, B(2) is set to 0. Because abs(ERR) is not less than MIN ERR (i.e. abs(−15.5) is not less than 1.7), N is decremented and the loop is repeated. POS ERR, MIN ERR, and BF remain unchanged.

With N decremented to 0, ERR=POS ERR−delta$2^{0'}$: ERR=1.7−16.7=−15. Because ERR is less than 0, B(1) is set equal to 0. Because abs(ERR) is not less than MIN ERR (i.e. abs(−15) is not less than 1.7), N is decremented and the loop is repeated. POS ERR, MIN ERR, and BF remain unchanged.

TABLE 4

| N | ERR | B(n) | POSS ERR | ERR < MIN ERR? | MIN ERR | BF |
|---|---|---|---|---|---|---|
| 4 | 87.5 | 1 | 87.5 | Y | 87.5 | −1 |
| 3 | 1.7 | 1 | 1.7 | Y | 1.7 | −1 |
| 2 | −34.6 | 0 | 1.7 | N | 1.7 | −1 |
| 1 | −15.5 | 0 | 1.7 | N | 1.7 | −1 |
| 0 | −15.0 | 0 | 1.7 | N | 1.7 | −1 |

Because N is now decremented to 0, the process continues as shown in FIG. 4B. Because bit flag counter BF is equal to −1, the process is ended.

Examining the contents of bit flag array B(n) and relating those contents to circuit 20 of FIG. 1, it is seen that "C" circuit paths have been selected for the highest order (i.e. delay stage 22) and the second-highest order (i.e. delay stage 24) stages of circuit 20. In fact, selecting those "C" circuit paths will yield a differential delay time of 238.3 ps (152.5 +85.8) relative to the minimal delay through the "B" circuit paths.

EXAMPLE 2

In this example, the desired delay is selected to be 100 ps. N is again initialized to 4, and MIN ERR to 152.5. Because the steps shown in FIG. 4A are performed analogously to those of example 1 above, the results are presented in summary form in Table 5, below.

TABLE 5

| N | ERR | B(n) | POSS ERR | ERR < MIN ERR? | MIN ERR | BF |
|---|---|---|---|---|---|---|
| 4 | −52.5 | 0 | 100.0 | Y | 52.5 | 4 |
| 3 | 14.2 | 1 | 14.2 | Y | 14.2 | −1 |
| 2 | −22.1 | 0 | 14.2 | N | 14.2 | 2 |
| 1 | −3.0 | 0 | 14.2 | Y | 3.0 | 1 |
| 0 | −2.5 | 1 | 14.2 | Y | 2.5 | 0 |

Analyzing the results of Table 5 with respect to the process of FIG. 4B, it is seen that when bit flag counter BF is checked the first time it is not equal to −1, but to 0. Therefor, continuing the process as shown in the FIG. 4B, B(BF) =B(0) is set equal to 1. The bit flag counter BF is decremented from 0 to −1, and the process is ended.

Examining the contents of the bit flag array B(N), it is seen that the flags are set to 1 for both the second from the highest order delay, and for the primed lowest order delay. The indicated "C" paths through circuit 20 of FIG. 1 are hence the delta$2^2$ "C" path of 85.8 ps plus the delta$2^{0'}$ "C" path of 16.7 ps for a total differential delay of 102.5 ps. The reader can straightforwardly convince himself that this is the optimum signal path to obtain the desired 100 ps delay. The only other path which is close would substitute the first lower order delay of 17.2 ps for the identified 16.7 ps path, increasing the time away from the desired 100 ps.

The inclusion of the multiple lower order delays, in this case the two lower order stages 28C and 30C of delay circuit 20, has been discovered by the present inventors to substantially increase the accuracy with which the desired delay can be generated. In fact, assuming that the actual, measured delay of each delay stage varies randomly about the theoretically expected delay, the inclusion of two or more lowest order delay stages will have an unexpectedly dramatic and substantial affect in reducing the error with which a sub-nanosecond delay in the above-described range can be generated.

Figure 5:
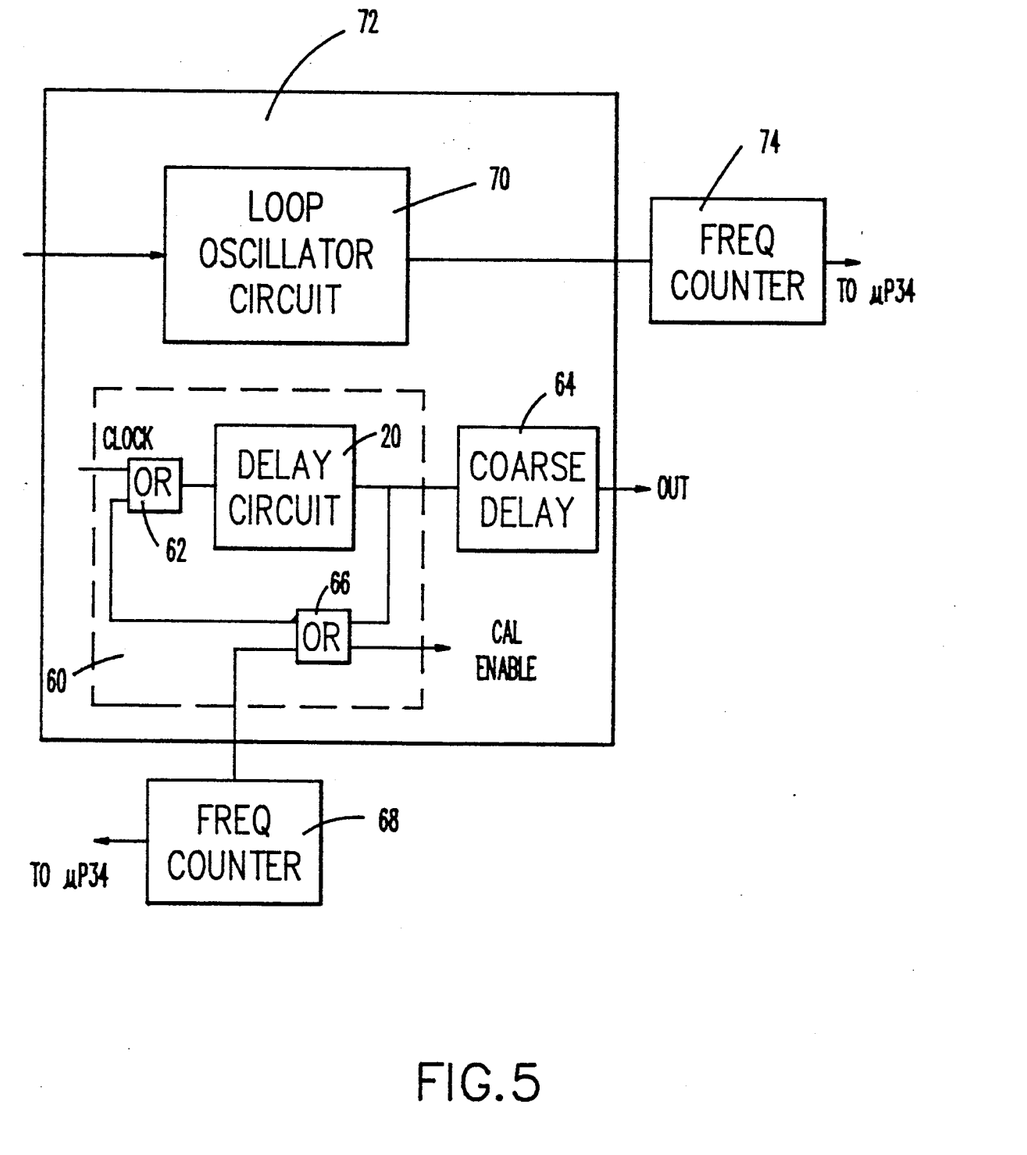
FIG. 5 is a block diagram showing means for compensating the operation of the delay circuit of FIG. 1 to accommodate such influencing factors as thermal drift and fluctuations in supply voltages.

Referring now to FIG. 5, a loop oscillator circuit 70 is shown situated on a portion of an integrated circuit chip 72 which also supports delay circuit 20 and calibration circuit 60. Loop oscillator circuit 70 comprises, for example, an arrangement of series-connected logic gates with a feedback path and a connection to a period counter 74.

In operation, the period of loop oscillator circuit 70 is measured with period counter 74 during the initial start-up of the logic on integrated circuit chip 72. This measuring of the loop oscillator frequency is performed substantially simultaneously with the initial calibration of delay circuit 20 as described above. The frequency of loop circuit 70 is then periodically monitored as chip portion 72 continues to operate, generating heat and eventually reaching full operating temperature. Because loop circuit 70 is positioned adjacent, and likely intertwined to some extent with delay circuit 20, changes in signal periods which are exhibited by loop circuit 70 can be presumed to be substantially identical to similar changes exhibited in delay circuit 20. A scaling factor is thus readily determined to scale any changes in gate delay times back to the gate delays measured at start-up (or at the first calibrating measurement).

In accordance with the present invention, the scaling factors determined by monitoring the frequency of loop oscillator circuit 70 are used to scale the delta delays measured through the various stages of delay circuit 20 during the calibration process described above. This scaling of the delta delays in delay circuit 20 is preferably performed in microprocessor 34, and requires substantially less time to perform than a complete recalibration of the type described above.

Table 6 below illustrates the scaling of the measured delta delays with a scaling factor, A, selected to compensate for a change in gate delays.

TABLE 6

| Measured Delta Delays | Scaled Delta Delays |
|---|---|
| $delta2^{0'}$ | $A \times delta2^{0'}$ |
| $delta2^{0}$ | $A \times delta2^{0}$ |
| $delta2^{1}$ | $A \times delta2^{1}$ |
| . | . |
| . | . |
| . | . |
| $delta2^{n}$ | $A \times delta2^{n}$ |

From a consideration of Table 6, it is seen that the scaling factor is applied easily and quickly by simple linear multiplication of the measured additional delays.

There has thus been provided a delay circuit which is programmable to generate selectable time delays in the subnanosecond range. In the embodiment shown, the minimum delay is determined by the propagation delay of a digital gate, and the delay is variable in binary increments. It will be understood, however, that the invention is not so limited. The delays may alternately be provided by other signal delaying means, such as conventional delay lines, and needn't be provided in a binary ladder format.

In accordance with the present invention, the generated delays are based on the actual, measured delay paths through the circuit, versus the theoretically calculated delays. The present invention thus provides a system for generating highly accurate, very fine delays in programmable increments. Methods and apparatus for calibrating the delay circuit and for selecting appropriate delay paths based on measured delay values are provided. Further provided is a method and apparatus for scaling the measured delays based on changes caused, for example, by thermal or supply voltage fluctuations. The subject invention has particular application in semiconductor chip testers, wherein selectable, highly accurate time delays are required in great quantity.

While the present invention has been described with respect to a particular embodiment, it will be understood by those skilled in the art that various changes and improvements may be made without departing from the spirit and scope of the present invention.

What is claimed is:

1. A method of operating a delay circuit to impose a selected delay on an electric signal, said delay circuit comprising a plurality of delay stages and means for directing said electronic signal serially through selected ones of said delay stages, said method comprising the steps of:
   providing said plurality of delay stages each having at least one substantially fixed but not precisely known delay;
   measuring the actual signal delay through each of said delay stages; and selecting, based on the signal delays obtained in said measuring step, the delay stages through which said electronic signals is directed.

2. A method in accordance with claim 1 wherein said selecting step includes the steps of:
   calculating the signal path which will provide an actual delay closest to said selected delay; and
   directing said electronic signal through the delay stages constituting the signal path determined in said calculating step.

3. A method of operating a programmable delay circuit to impose a selected delay on an electronic signal, said delay circuit comprising a plurality of delay stages, each of said delay stages including first and second signal paths for said electronic signal, said first signal path having a reference delay, said second signal path having said reference delay plus an additional delay, said method comprising the steps of:
   providing said plurality of delay stages, each of said second signal paths having a substantially fixed but not precisely known additional delay;
   measuring the actual additional delay through each of said second signal paths; and
   selecting, based on the additional delays obtained in said measuring step, the first or second signal path through each of said delay stages.

4. A method in accordance with claim 3 wherein said measuring step includes the steps of:
   measuring the total delay through all of said first signal paths;
   measuring the total delay through each individual one of said second signal paths; and
   calculating the actual additional delay through each of said second signal paths.

5. A method in accordance with claim 3 wherein said selecting step includes the steps of:
   determining which combination of the second signal paths in said delay stages will provide additional delays totaling closest to said selected delay; and
   directing said electronic signal through the second signal paths selected in said determining step.

6. A method in accordance with claim 3 wherein the additional delay in the second signal path of each of said delay stages is equal to approximately a power of 2 times a minimum delta delay, and further including the step of: providing at least two delay stages each including a second signal path having a lowest order $2^{\circ}$ additional delay.

7. A method in accordance with claim 3 and further including the step of scaling the measured additional delays to compensate for changes in said delay circuit before performing said selecting step.

8. A method of imposing a selected delay on an electronic signal comprising the steps of:

providing a plurality N of delay stages, each of said N delay stages including first and second signal paths for said electronic signal, said first signal path having a minimum delay, said second signal path having said minimum delay plus an additional substantially fixed delay equal to approximately a power of 2 times a minimum delta delay, measuring the total delay through said first signal paths;

measuring the delay through each individual one of said second signal paths;

calculating the additional delay through each individual one of said second signal paths;

determining which combination of said second signal paths will provide a total additional delay closest to said selected delay; and directing said electronic signal through the second signal paths selected in said determining step.

9. A method in accordance with claim 8 and further including the step of providing at least two of said delay stages including second signal paths having lowest order $2^0$ additional delays.

10. A method in accordance with claim 9 wherein said delay circuit is fabricated on a single semiconductor chip and further including the step of scaling the calculated additional delays to compensate for variations in the calculated additional delays caused by such factors as thermal drift.

11. A delay circuit for imposing a selected delay on an electronic signal, comprising:

a plurality of delay stages, each having at least one substantially fixed but not precisely known delay;

means for directing said electronic signal through selected ones of said delay stages;

means for measuring the actual signal delay through each of said delay stages; and means for selecting, based on the actual signal delays obtained in said measuring step, the delay stages through which said electronic signal is directed.

12. A delay circuit in accordance with claim 11 wherein said selecting means includes means for calculating a signal path through said delay stages which will provide an actual delay closest to said selected delay.

13. A programmable delay circuit for imposing a selected delay on an electronic signal, said delay circuit comprising:

a plurality of delay stages, each of said delay stages including first and second signal paths for said electronic signal, said first signal path having a reference delay, said second signal path having said reference delay plus a substantially fixed but not precisely known additional delay;

means for measuring the actual additional delay through each individual one of said second signal paths; and means for selecting, based on the additional delays obtained by said measuring means, the first or second signal path through each of said delay stages.

14. A delay circuit in accordance with claim 13 wherein said measuring means includes:

means for measuring the total delay through all of said first signal paths in said delay circuit;

means for measuring the total delay through said delay circuit when each of said second signal paths is selected one at a time; and means for calculating the actual additional delay through each individual one of said second signal paths.

15. A delay circuit in accordance with claim 13 wherein said selecting means includes:

means for determining which combination of said second signal paths will provide a total additional delay closest to said selected delay; and means for directing said electronic signal through the second signal paths selected in said determining step.

16. A delay circuit in accordance with claim 13 wherein:

the additional delay in the second signal path of each of said delay stages is equal to about a power of 2 times a minimum delta delay; and further including at least two delay stages each including a second signal path having a lowest order $2^0$ additional delay.

17. A delay circuit in accordance with claim 13 and further including means for scaling the actual additional delays to compensate for changes in said delay circuit before performing said selecting step.

18. A delay circuit for imposing a selected delay on an electronic signal comprising:

a plurality N of delay stages, each of said N delay stages including first and second signal paths for said electronic signal, said first signal path having a minimum delay, said second signal path having said minimum delay plus an additional, substantially fixed delay equal to about a power of two times a minimum delta delay;

means for measuring the total delay through said first signal paths;

means for measuring the individual delay through each of said second signal paths;

means for calculating the additional delay through each of said second signal paths;

means for determining which combination of said second signal paths will provide an additional delay closest to said selected delay; and means for directing said electronic signal through the second signal paths selected by said determining means.

19. A delay circuit in accordance with claim 18 and further comprising at least two of said delay stages including second signal paths having lowest order $2^0$ additional delays.

20. A delay circuit in accordance with claim 19 wherein said delay circuit is fabricated on a single semiconductor chip and further including means for scaling the calculated additional delays to compensate for changes in the calculated additional delays caused by such factors as thermal drift.

21. A delay circuit in accordance with claim 20 wherein said scaling means includes:

means for generating a periodic signal fabricated on the same semiconductor chip as said delay circuit;

means for measuring the frequency of said generating means;

means for calculating scaling factors pursuant to changes in the frequency of said generating means; and means for applying said scaling factors to the measured additional delays.

* * * * *